(12) United States Patent
Shiki et al.

(10) Patent No.: US 8,088,693 B2
(45) Date of Patent: Jan. 3, 2012

(54) SUBSTRATE TREATMENT METHOD

(75) Inventors: Yoshimichi Shiki, Kumamoto (JP); Seiji Oda, Kagoshima (JP); Hayato Iwamoto, Kanagawa (JP); Yoshiya Hagimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 1113 days.

(21) Appl. No.: 11/542,138

(22) Filed: Oct. 4, 2006

(65) Prior Publication Data
US 2007/0105242 A1 May 10, 2007

(30) Foreign Application Priority Data

Oct. 14, 2005 (JP) ................. P2005-299579
Aug. 9, 2006 (JP) ................. P2006-216540

(51) Int. Cl.
*H01L 21/302* (2006.01)
(52) U.S. Cl. ............. 438/745; 438/5; 216/79; 134/96.1; 134/98.1; 134/111; 134/151
(58) Field of Classification Search ............ 216/79; 438/5, 745; 134/25, 96.1, 98.1, 111, 151, 134/172
See application file for complete search history.

(56) References Cited

U.S. PATENT DOCUMENTS

| 6,945,259 | B2 * | 9/2005 | Masui et al. | 134/56 R |
| 2002/0023671 | A1 * | 2/2002 | Mitsumori et al. | 134/151 |
| 2005/0133066 | A1 * | 6/2005 | Takahashi | 134/25.4 |
| 2005/0158671 | A1 * | 7/2005 | Shimizu et al. | 430/329 |

FOREIGN PATENT DOCUMENTS

| JP | 07-256222 A | 10/1995 |
| JP | 2002-373879 | 12/2002 |

OTHER PUBLICATIONS

V. Pham, Journal of Supercritical Fluids, vol. 31, (2004) pp. 323-328.*
Japanese Office Action issued Dec. 7, 2010 for corresponding Japanese Application. No. 2006-216540.

* cited by examiner

*Primary Examiner* — Nadine G Norton
*Assistant Examiner* — Maki Angadi
(74) *Attorney, Agent, or Firm* — Rader, Fishman & Grauer PLLC

(57) ABSTRACT

There is provided a substrate treatment method for performing treatment by feeding a chemical liquid to a surface of a substrate, in which, before feeding the chemical liquid to a predetermined area of the substrate, a liquid substance having a resistivity lower than that of the chemical liquid is fed to the surface of the substrate so that the liquid substance wets at least the predetermined area, and then, the chemical liquid is fed to the predetermined area so that the treatment is performed on the substrate with the chemical liquid fed to the surface of the substrate.

11 Claims, 3 Drawing Sheets

FIG. 3
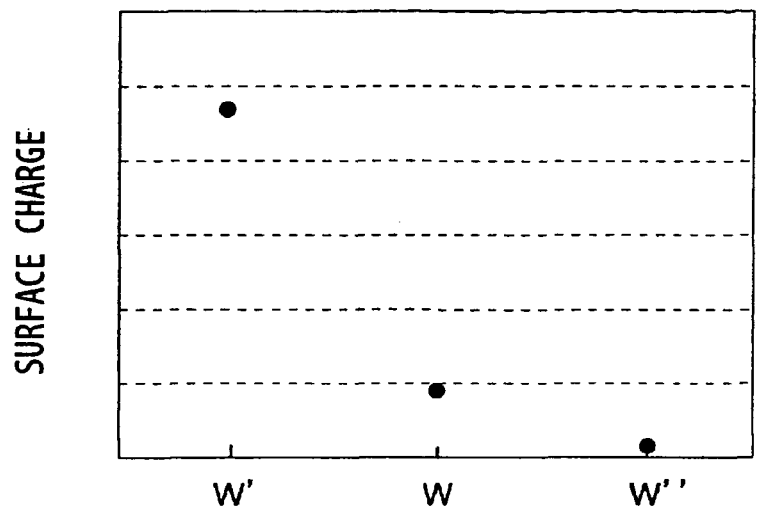
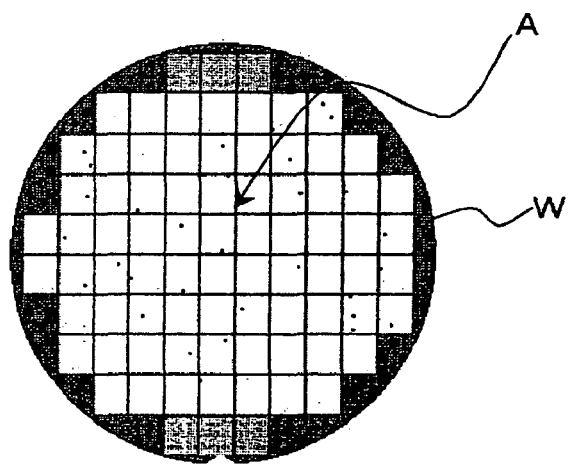
FIG. 4A
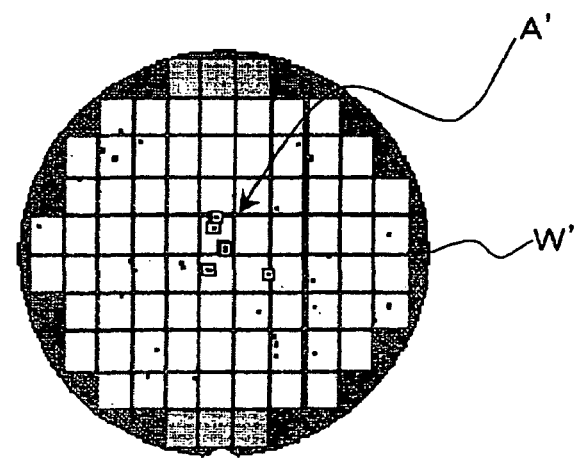
FIG. 4B

SUBSTRATE TREATMENT METHOD

CROSS REFERENCES TO RELATED APPLICATIONS

The present document contains subject matter related to Japanese Patent Applications JP 2005-299579 and JP 2006-216540 filed in the Japanese Patent Office on Oct. 14, 2005 and Aug. 9, 2006, respectively, the entire contents of which being incorporated herein by reference.

BACKGROUND OF THE INVENTION

1. Field of the Invention

The present invention relates to a substrate treatment method. More particularly, the present invention is related to a substrate treatment method by single wafer processing using a chemical liquid.

2. Description of Related Art

In a wet process (e.g., surface cleaning, oxide etching, and resist removal) of the semiconductor fabrication process, a surface treatment using a rotary, single wafer processing apparatus is conducted. Specifically, a wafer is held by a holding member set in a processing chamber of the single wafer processing apparatus, and the holding member is spun. Then, a chemical liquid, such as diluted hydrofluoric acid (DHF) or sulfuric acid ($H_2SO_4$)/$H_2O_2$, is fed to the wafer at a portion close to the spin center from a nozzle arranged above the holding member. The chemical liquid flows on the wafer in the direction to the outer periphery due to a centrifugal force, thus achieving a desired surface treatment. After completion of the surface treatment, the wafer is cleaned by feeding pure water to the wafer surface to remove the chemical liquid component.

It has been known that the cleaning treatment of the wafer using pure water has the following problem. Since pure water has a resistivity as large as 18 MΩ·cm, in an area of the wafer surface to which the pure water is fed, when this area touches the pure water, static electricity is generated due to the friction of the pure water against the wafer, so that the wafer surface is locally charged. For this reason, there occur troubles such as breaking of a gate oxide film or dissolving of a metal film constituting a wiring or electrode. For solving the problem, an attempt has been made to add carbon dioxide ($CO_2$) gas or ammonia ($NH_3$) gas to pure water to lower the resistivity of the pure water, thereby preventing the wafer from being charged (see, for example, Japanese Patent Application Publication (KOKAI) No. 2002-373879).

On the other hand, it has been known that a chemical liquid used in the above-mentioned wet process, particularly in the cleaning treatment of the wafer is ionized into ions and hence generally has a low resistivity. For example, SC1 (ammonia+hydrogen peroxide+water), which is a chemical liquid for removing organic substances on the wafer surface, or SC2 (hydrochloric acid+hydrogen peroxide+water), which is a chemical liquid for removing metals on the wafer surface, has a high ion concentration. Therefore, an area of the wafer surface to which such a chemical liquid is fed is unlikely to be charged when the area touches the chemical liquid.

SUMMARY OF THE INVENTION

However, a chemical liquid, such as a hydrofluoric acid solution having an extremely low concentration used in an etching process for an oxide film, or concentrated sulfuric acid used in the resist removal, has a low degree of electrolytic dissociation and hence the ion concentration of the chemical liquid is extremely small, and thus the chemical liquid has a high resistivity. Therefore, when a chemical liquid L having a high resistivity is fed to the surface of a spinning wafer W' shown in FIG. 1A from a nozzle 21 arranged above the wafer W' as shown in FIG. 1B, an area A' of the wafer surface to which the chemical liquid L is fed is locally strongly charged due to an electrostatic friction phenomenon when the area A' touches the chemical liquid L, so that the area is likely to suffer a damage. Specific damages include a phenomenon such that a gate oxide film formed on the surface of the wafer W' breaks, and a phenomenon such that an Si substrate constituting the wafer W' is scraped. The surface of the wafer W' suffers damage, thus lowering the product yield.

When, similarly to the case of the pure water, $CO_2$ gas or $NH_3$ gas is added to the chemical liquid L to lower the resistivity of the chemical liquid L, the chemical liquid L is disadvantageously lowered in treatment performance.

For solving the above problems, there is provided a substrate treatment method while preventing an area of the substrate to which a chemical liquid is fed from suffering damage.

The substrate treatment method according to an embodiment of the present invention is a substrate treatment method by feeding a chemical liquid to the surface of a substrate to treat the substrate. In the method, before feeding the chemical liquid to a predetermined area of the substrate, feeding a liquid substance having a resistivity lower than that of the chemical liquid to the surface of the substrate so that the liquid substance wets at least the predetermined area, and then feeding the chemical liquid to the predetermined area, thereby treating the substrate with the chemical liquid fed to the surface of the substrate.

In the substrate treatment method according to the embodiment of the present invention, even in a case of feeding a chemical liquid having a high resistivity to a certain area of the substrate, the chemical liquid is fed after a liquid substance having a resistivity lower than that of the chemical liquid is fed to the area. Therefore, when the surface of the substrate first touches the chemical liquid, the liquid substance having a lower resistivity serves as a cushioning material, preventing the chemical liquid having a high resistivity from being directly brought into contact with the surface of the substrate. Thus, the area of the surface of the substrate to which the chemical liquid is fed is prevented from being locally charged due to an electrostatic friction phenomenon.

BRIEF DESCRIPTION OF THE DRAWINGS

FIG. 3 is a graph showing surface charges of a wafer W (Example 1) treated by the method for treating a substrate according to the embodiment of the present invention shown in FIG. 2, a wafer W' (Comparative Example 1) treated by the related art method for substrate treatment shown in FIG. 1, and an untreated wafer W"; and FIGS. 4A and 4B are defect maps of the wafer W and the wafer W'.

DESCRIPTION OF EMBODIMENT

Hereinbelow, an embodiment of the present invention will be described in detail with reference to the accompanying drawings. As an example of the substrate treatment method, removal of a resist pattern remaining on the surface of the substrate using concentrated sulfuric acid is described below.

Figure 2A:
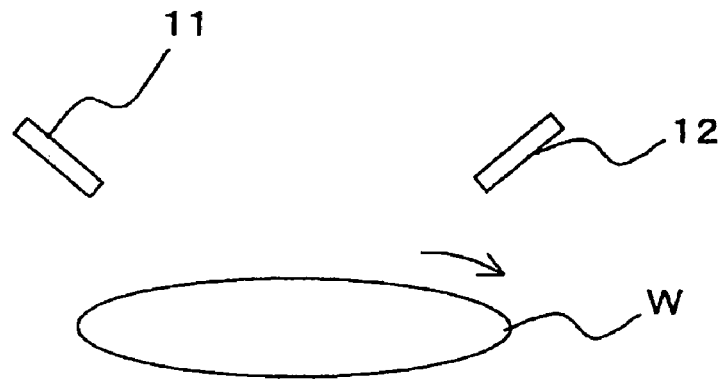
FIGS. 2A to 2C are diagrammatic views for explaining the steps of a substrate treatment method according to an embodiment of the present invention.

As shown in FIG. 2A, a wafer W having, for example, a residual resist pattern is first introduced into a processing chamber of a not shown single wafer processing apparatus, and the wafer W is held by a holding member set in the processing chamber. In the processing chamber, above the holding member are arranged a second nozzle 12 for feeding a chemical liquid to the surface of the wafer W held by the holding member and a first nozzle 11 for feeding a liquid substance having a resistivity lower than that of the chemical liquid to the surface of the wafer W. Then, the holding member is spun while keeping the wafer W horizontal.

Figure 2B:
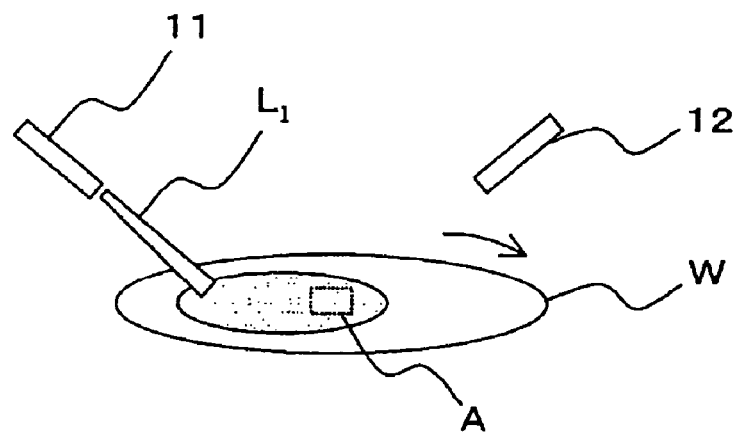

Then, as shown in FIG. 2B, a liquid substance $L_1$ having a resistivity lower than that of the chemical liquid is fed to the surface of the wafer W from the first nozzle 11 so that the liquid substance $L_1$ wets at least an area A to which the chemical liquid is to be fed, thus achieving a pre-wet treatment.

As the liquid substance $L_1$ having a resistivity lower than that of the chemical liquid, specifically, a liquid substance having a higher degree of electrolytic dissociation and a higher ion concentration than those of the chemical liquid and having a resistivity controlled to be about 0.1 MΩ·cm to 0.5 MΩ·cm is used. Further, it is necessary that the liquid substance $L_1$ be an inert liquid which does not react with materials constituting devices on the wafer W.

As mentioned below, concentrated sulfuric acid is used as the chemical liquid and therefore, as the liquid substance $L_1$, an inert liquid having a resistivity lower than that of the concentrated sulfuric acid is used. Examples of inert liquids having a lower resistivity include pure water containing $CO_2$ gas ($CO_2$ water) and pure water containing $NH_3$ gas. In the present embodiment, $CO_2$ water having a resistivity controlled to be, for example, about 0.1 MΩ·cm is fed.

In feeding the liquid substance $L_1$ to the surface of the wafer W, the amount of the liquid substance $L_1$ fed is, for example, 50 ml or more and 300 ml or less and the spinning speed of the wafer W is 50 rpm or less, preferably 20 rpm or less so that the surface of the liquid substance $L_1$ swells out on the wafer due to the surface tension. In this case, it is preferable that, in the step for feeding the chemical liquid mentioned below, the chemical liquid is fed into the liquid substance $L_1$ having a satisfactory thickness covering the area A, and therefore the liquid substance $L_1$ advantageously serves as a cushioning material, thereby preventing the chemical liquid having a high resistivity from being directly brought into contact with the surface of the wafer W. In the present embodiment, the liquid substance $L_1$ is fed to the spinning wafer W, but the liquid substance $L_1$ may be fed to the wafer W which is not spinning.

Figure 2C:
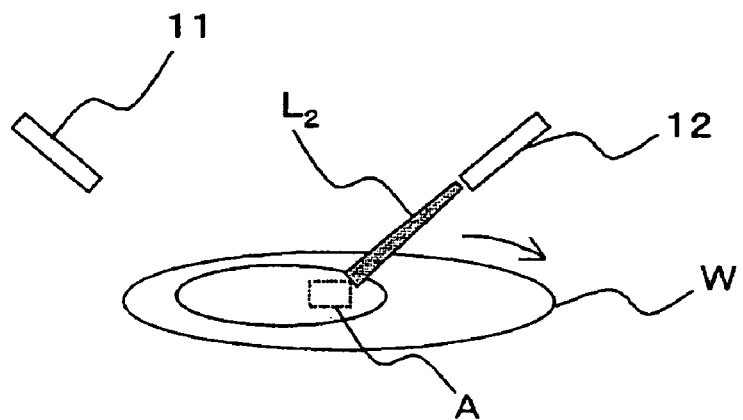

Next, as shown in FIG. 2C, feeding of the liquid substance $L_1$ is stopped, and a chemical liquid $L_2$ composed of, e.g., concentrated sulfuric acid (90 to 98% by weight) is fed to the area A to which the liquid substance $L_1$ has been fed. The chemical liquid $L_2$ is a liquid having a resistivity as high as 0.5 MΩ·cm to 20 MΩ·cm. In this instance, as mentioned above, the surface of the liquid substance $L_1$ fed to the area A swells out on the wafer due to the surface tension, and therefore the chemical liquid $L_2$ is fed onto the liquid substance $L_1$. The chemical liquid $L_2$ composed of concentrated sulfuric acid being in contact with the liquid substance $L_1$ causes an ionization reaction represented by the following formula (1):
[Chemical Formula 1]

$$H_2SO_4 + 2H_2O \rightarrow 2H_3O^+ + SO_4^{2-} \qquad (1)$$

In this reaction, the concentrated sulfuric acid is changed to diluted sulfuric acid containing a large amount of ions, namely, having an increased degree of electrolytic dissociation. Therefore, the chemical liquid $L_2$ having a high resistivity itself is not directly in contact with the area A, and the chemical liquid $L_2$ lowered in its resistivity is brought into contact with the area A, so that the area A is prevented from being locally charged due to an electrostatic friction phenomenon which possibly occurs when the surface of the wafer W first touches the chemical liquid $L_2$.

Then, the spinning speed of the wafer W is increased so that the chemical liquid $L_2$ flows on the wafer in the direction to the outer periphery to remove the resist pattern on the wafer W by the chemical liquid $L_2$ fed to the surface of the wafer W, thereby achieving a surface treatment of the wafer W. In this instance, the spinning speed of the wafer W is gradually increased to, for example, the range of 300 rpm or more and 800 rpm or less so that the liquid covering the surface of the wafer W is gradually changed from a mixture of the liquid substance $L_1$ and the chemical liquid $L_2$ to the chemical liquid $L_2$ only, thus inhibiting the friction of the chemical liquid $L_2$ against the wafer W from suddenly rising. In this case, not only can the whole surface of the wafer W be prevented from being charged, but also the surface treatment of the wafer W can be performed in such a state that no liquid substance $L_1$ remains, and therefore the surface treatment of the wafer W can be achieved without lowering the treatment performance of the chemical liquid $L_2$. The amount of the chemical liquid $L_2$ fed is, for example, 500 ml or more and 1,500 ml or less.

In the treatment method for a wafer W according to the present embodiment, even in a case of feeding the chemical liquid $L_2$ having a high resistivity, before feeding the chemical liquid $L_2$ the area A, the liquid substance $L_1$ having a resistivity lower than that of the chemical liquid $L_2$ is fed to the area A, and then the chemical liquid $L_2$ is fed. When the surface of the wafer W is to first touch the chemical liquid $L_2$, the liquid substance $L_1$ having a lower resistivity serves as a cushioning material, thereby preventing the chemical liquid $L_2$ having a high resistivity from being directly brought into contact with the surface of the wafer W. Thus, the area of the surface of the wafer W to which the chemical liquid $L_2$ is fed is prevented from being locally charged due to the electrostatic friction phenomenon. Accordingly, the wafer W is prevented from suffering damage due to the local charging, so that the yield of a device using the resultant wafer W can be improved.

Further, in the treatment method for a wafer W according to the present embodiment, the liquid substance $L_1$ is fed to the surface of the wafer W so that the surface of the liquid substance $L_1$ swells out on the wafer due to the surface tension. Therefore, the liquid substance $L_1$ can fully exhibit its excellent cushioning effect.

Figure 1:
FIGS. 1A and 1B are diagrammatic views for explaining the steps of a related art method for substrate treatment.
Figure 1:
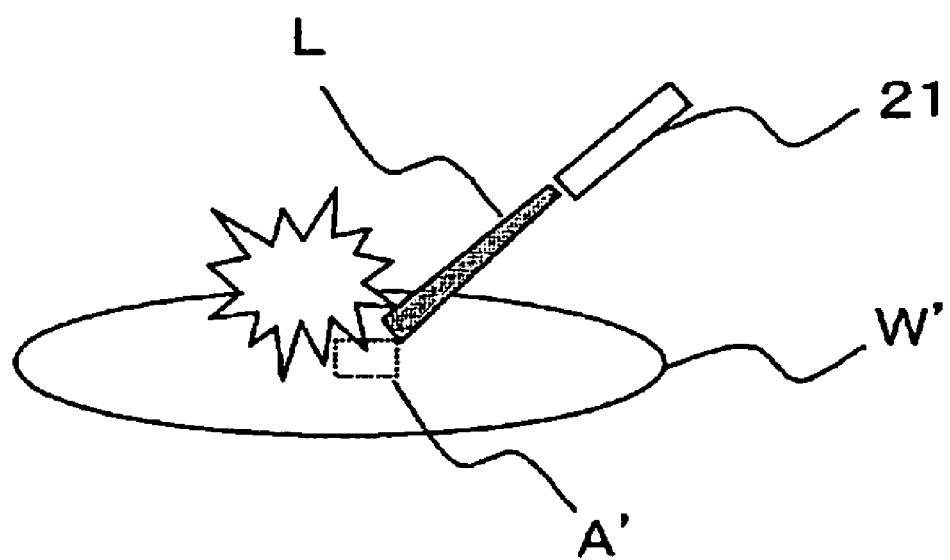

In a graph of FIG. 3, the results of the measurement of surface charge are shown with respect to a wafer W (Example 1) treated by the substrate treatment method according to the embodiment described above with reference to FIG. 2, a wafer W' (Comparative Example 1) treated by the related art substrate treatment method described above with reference to FIG. 1, and an untreated wafer W". Surface charges were measured while scanning over the entire surface of each wafer, and an average of the surface charges measured at different points was plotted on a graph as a surface charge. As the chemical liquid $L_2$ for treating the wafers W, W', concentrated sulfuric acid was used, and, as the liquid substance $L_1$ first fed to the surface of the wafer W, $CO_2$ water was used.

The graph has confirmed that the wafer W has a high surface charge, as compared to the untreated wafer W", but the wafer W has an extremely low surface charge, as compared to the wafer W' treated by the related art substrate treatment method.

FIGS. 4A and 4B show defect maps of the wafer W (Example 1) and the wafer W' (Comparative Example 1), respectively. The maps have confirmed that, in the wafer W treated by the method of the embodiment of the present invention, no defect-concentrated region is found in or near the area A to which the chemical liquid is fed, whereas, in the wafer W', defects are concentrated in or near an area A' to which the chemical liquid is fed.

In the above embodiment, an example using concentrated sulfuric acid as the chemical liquid $L_2$ is described, but, when using DHF of about 0.001 vol % to 0.002 vol % as the chemical liquid $L_2$, an effect similar to that obtained in the above embodiment can be achieved. In this case, the chemical liquid $L_2$ has a very low ion concentration and hence has a high resistivity, but the chemical liquid $L_2$ composed of DHF is fed to the area A to which the liquid substance $L_1$ has been fed, and the lower ion concentration of the chemical liquid $L_2$ is buffered by the liquid substance $L_1$ having a higher ion concentration. Therefore, when the surface of the wafer W first is to touch the chemical liquid $L_2$, the liquid substance $L_1$ having a lower resistivity serves as a cushioning material, preventing the chemical liquid $L_2$ having a high resistivity from being directly brought into contact with the surface of the substrate. Thus, the area of the surface of the wafer W to which the chemical liquid $L_2$ is fed is prevented from being locally charged due to an electrostatic friction phenomenon.

Further, in the above embodiment, the present invention is described taking a treatment of the surface of the wafer W as an example, but the present invention can be applied to a treatment of the back surface of the wafer W.

As described above, in the substrate treatment method according to the embodiment of the present invention, the surface of the substrate is prevented from being locally charged due to an electrostatic friction phenomenon which possibly occurs when the surface of the substrate first touches a chemical liquid. Therefore, an area of the surface of the substrate to which the chemical liquid is fed is prevented from suffering damage due to the charging, so that the yield of a device using the resultant substrate can be improved.

It should be understood by those skilled in the art that various modifications, combinations, sub-combinations and alterations may occur depending on design requirements and other factors insofar as they are within the scope of the appended claims or the equivalents thereof.

What is claimed is:

1. A substrate treatment method for performing treatment by feeding a chemical liquid to a surface of a substrate, comprising the steps of:

before feeding the chemical liquid to a predetermined area of the substrate, feeding a liquid substance having a resistivity lower than that of the chemical liquid to the surface of the substrate so that the liquid substance wets at least the predetermined area, feeding the chemical liquid to the predetermined area, and treating the substrate with the chemical liquid fed to the surface of the substrate.

2. The method according to claim 1, wherein the liquid substance is fed to the surface of the substrate so that a surface of the liquid substance swells on the substrate due to the surface tension.

3. The method according to claim 1, wherein an amount of the liquid substance to be fed is 50 ml or more and 300 ml or less.

4. The method according to claim 1, wherein the substrate has a spinning speed of 0 rpm or more and 20 rpm or less during the feeding of the liquid substance.

5. The method according to claim 1, wherein an amount of the chemical liquid to be fed is 500 ml or more and 1,500 ml or less.

6. The method according to claim 1, wherein the substrate has a spinning speed of 300 rpm or more and 800 rpm or less during the treatment of the substrate with the chemical liquid.

7. The method according to claim 1, wherein the liquid substance is an inert liquid which does not react with materials constituting the materials of the substrate.

8. The method according to claim 1, wherein at least the chemical liquid is prevented from being directly brought into contact with the substrate in the predetermined area.

9. The method according to claim 1, wherein the chemical liquid is composed of concentrated sulfuric acid in the range of 90 to 98% by weight.

10. The method according to claim 9, wherein the concentrated sulfuric acid has a resistivity as high as 0.5 MΩ·cm to 20 MΩ·cm.

11. The method according to claim 1, wherein the chemical liquid is composed of diluted hydrofluoric acid in the range of 0.0001 vol % to 0.0002 vol%.

\* \* \* \* \*